United States Patent [19]
Ganapol et al.

[11] Patent Number: 5,110,628
[45] Date of Patent: May 5, 1992

[54] METHOD AND APPARATUS FOR MARKING OR ERASING A MARKING ON A SEMICONDUCTOR CHIP PACKAGE

[75] Inventors: David L. Ganapol, Scotts Valley; Gary L. Small, San Jose, both of Calif.

[73] Assignee: VLSI Technology, Inc., San Jose, Calif.

[21] Appl. No.: 494,246

[22] Filed: Mar. 15, 1990

[51] Int. Cl.$^5$ .................. B05D 5/00; B05C 13/02; B08B 11/02
[52] U.S. Cl. .................. 427/256; 427/294; 118/50; 118/500; 134/902
[58] Field of Search .............. 118/50, 319, 500; 427/294, 96, 295, 296, 287, 256; 134/902; 15/88.2, 88.3

[56] References Cited

U.S. PATENT DOCUMENTS

| | | |
|---|---|---|
| 3,538,883 | 11/1970 | Polin .................. 118/50 X |
| 3,675,563 | 7/1972 | Metreaud .............. 118/50 X |
| 4,418,639 | 12/1983 | Wills et al. ............... 118/50 |
| 4,594,263 | 6/1986 | Folk et al. ............. 427/343 X |
| 4,938,994 | 7/1990 | Choinski ................. 427/96 |
| 4,959,246 | 9/1990 | Cleemput ............. 427/294 X |

FOREIGN PATENT DOCUMENTS 59-51555  3/1984  Japan .................. 427/96

OTHER PUBLICATIONS

Jorgensen, R. R., et al., "Wafer Angular Alignment Detection and Positioning System", IBM TDB, vol. 14, No. 11, Apr. 1972, pp. 3239-3242.

Primary Examiner—Evan Lawrence
Attorney, Agent, or Firm—Majestic, Parson, Siebert & Hsue

[57] ABSTRACT

A method and apparatus for marking or erasing a marking on a semiconductor chip package having leads. The apparatus comprises a circular disk has many pockets on one surface near its circumference suitable for holding semiconductor chips. Each pocket has a pedestal rising from the bottom of the pocket and suitable for supporting the bottom portion of a semiconductor chip package. The edges of the pocket and the pedestal define between them space suitable for housing the leads of the package. The pedestal has a hole therein which can be evacuated so that the package is held to the pedestal by atmospheric pressure so that the top surface of the package may be marked or in marking thereon can be erased. Thus the package is held to the pedestal by sufficient force for the marking or erasing process. The leads of the package are therefore not bent or otherwise disturbed. Rotation of the disk allows the packages to be sequentially marked or erased.

17 Claims, 3 Drawing Sheets

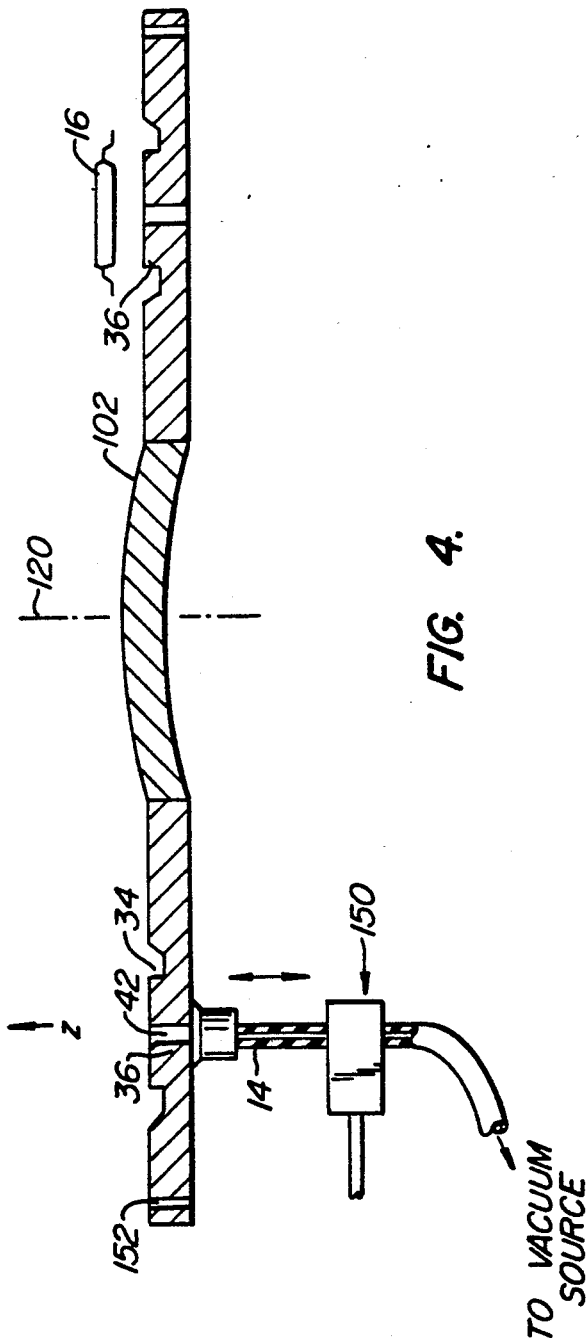
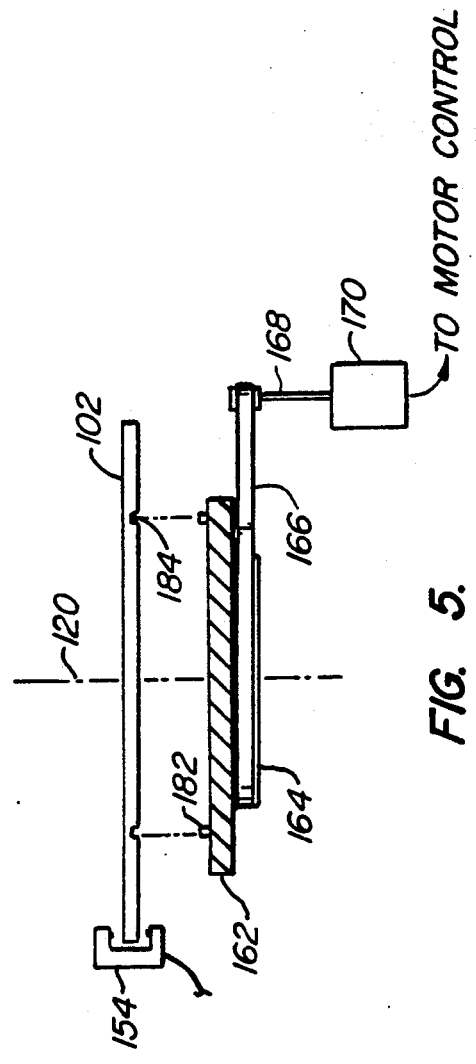

METHOD AND APPARATUS FOR MARKING OR ERASING A MARKING ON A SEMICONDUCTOR CHIP PACKAGE

BACKGROUND OF THE INVENTION

This invention relates to a system for marking or erasing the marking of a semiconductor chip package with leads.

Semiconductor chip packages are usually marked for a number of reasons. Thus the packages are frequently marked to identify the manufacturer; they are also marked to identify performance characteristics of the chip such as speed. When the packages are marked to identify a particular company, the package housing may be pre-marked before the housing is used to house the semiconductor chip. However, when the package is to be marked for speed or other performance characteristics, it is frequently desirable to perform the marking after the package is tested. Such testing is normally performed after the leads of the package have been trimmed and formed. The package is simply held manually for marking, as is sometimes performed conventionally. In such circumstances, it may be difficult to avoid bending or otherwise deforming the leads during the marking process. In quad-flat pack (QFP) packages, for example, it is crucial for the leads present on all four sides of the package to remain coplanar. Since the marking process causes a significant force to be applied to the package, it is difficult to avoid bending or otherwise disturbing the coplanarity of the leads during the marking process.

Sometimes semiconductor chip packages may be mismarked so that it is necessary to erase a marking and then remark the package. The erasing and remarking processes are generally performed after the leads are trimmed and formed so that it is difficult to avoid bending or otherwise disturbing the leads during these processes. It is therefore desirable to provide a system for marking or erasing a marking from a semiconductor chip package having leads without bending or otherwise disturbing the leads.

SUMMARY OF THE INVENTION

The system of this invention includes a method and apparatus for marking or erasing a marking on a semiconductor chip package having leads. The apparatus comprises a support structure for supporting the package where the structure defines a conduit means therein, and means connected to the conduit means for evacuating it. The apparatus further comprises means for marking or erasing a marking on the package when the package is supported by said structure when the conduit means is evacuated by the evacuating means, so that the package is held to the support structure by sufficient force for the marking or erasing, and so that the leads of the package are not disturbed during the marking or erasing.

BRIEF DESCRIPTION OF THE DRAWINGS

FIG. 4 is a cross-sectional view of the system of FIG. 2, including rotary disk 102, a QFP package, and a vacuum device to illustrate the preferred embodiment of the invention.

FIG. 5 is a cross-sectional view of the system of FIG. 2, including the rotary disk 102 of FIGS. 2-4, a sensor for sensing the position of the disk and a rotation mechanism for rotating the disk to illustrate the preferred embodiment of the invention.

DETAILED DESCRIPTION OF THE INVENTION

Figure 1:
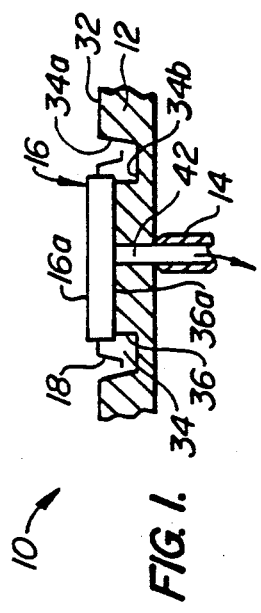
FIG. 1 is a cross-sectional view of a semiconductor chip package, a vacuum device and of a support structure having a surface with a depression therein and a pedestal rising from the bottom of the depression to support the semiconductor chip package for marking or for erasing a marking to illustrate the preferred embodiment of the invention.

FIG. 1 is a cross-sectional view of a portion of an apparatus for supporting and holding a semiconductor chip package with leads with sufficient force and in a manner that would not disturb the leads when the package is being marked or when the marking is being erased from the package. As shown in FIG. 1, the portion 10 of an apparatus includes a support structure 12 and a vacuum device 14 for supporting and holding a semiconductor chip package 16. Package 16 has a top surface 16a suitable to be marked (or has a marking thereon that should be erased) and leads 18.

When surface 16a is marked or when a marking on surface 16a is to be erased, package 16 should be held with sufficient force in order for the marking or the erasing of a marking to be performed. On the other hand, when package 16 is held for such purpose, leads 18 are likely to be bent or otherwise disturbed, which is undesirable. It is therefore desirable to provide an apparatus which can hold package 16 with sufficient force for marking or for erasing a marking without bending or disturbing the leads 18. Support structure 12 and vacuum device 14 together perform such function.

Support structure 12 has a main surface 32 with a depression 34 therein defined by drop-off surfaces 34a and bottom surface 34b. A pedestal 36 rises from the bottom surface 34b of the depression where the pedestal is suitable for supporting package 16 when the package is placed on top of the pedestal. Depression 34 is at an elevation below the main surface 32 when the structure 12 is oriented in a position (as shown in FIG. 1) to support a package for marking or erasing. Pedestal 36 and drop-off surfaces 34a define between them a space surrounding the pedestal for housing leads 18 when the pedestal is supporting the package, so that the leads do not contact structure 12.

Structure 12 defines therein a conduit 42 which may simply be a hole situated so that it is underneath package 16 when the package is supported by the pedestal. Vacuum tube 14 is connected to a vacuum pump (not shown) where the tube 14 is matched to hole 42 to evacuate the hole. Atmospheric pressure therefore applies a downward force on package 16 to hold package 16 to the support structure 12 with sufficient force for marking or for erasing a marking from surface 16a. In such manner, package 16 is held to support structure 12 in a manner that does not bend or otherwise disturb leads 18 during the marking or erasing process.

The drop-off surfaces 34a are chamfered as shown in FIG. 1, so that when the package is placed into depression 34 and onto the pedestal 36, the package will be automatically centered onto the pedestal. Preferably, of course, the package 16 is placed carefully onto pedestal 36 so that leads 18 will not touch the drop-off surfaces 34a to avoid bending or disturbing the leads. An apparatus for placing package 16 onto the pedestal which prevents the leads from touching surfaces 34a is described below. The top surface 36a of the pedestal is at such an elevation relative to the main surface 32 that when the package is in contact with surface 36a and supported by structure 12 as shown in FIG. 1, surface 16a of the package is above the main surface 32 so that the marking or erasing is conveniently performed.

Figure 2:
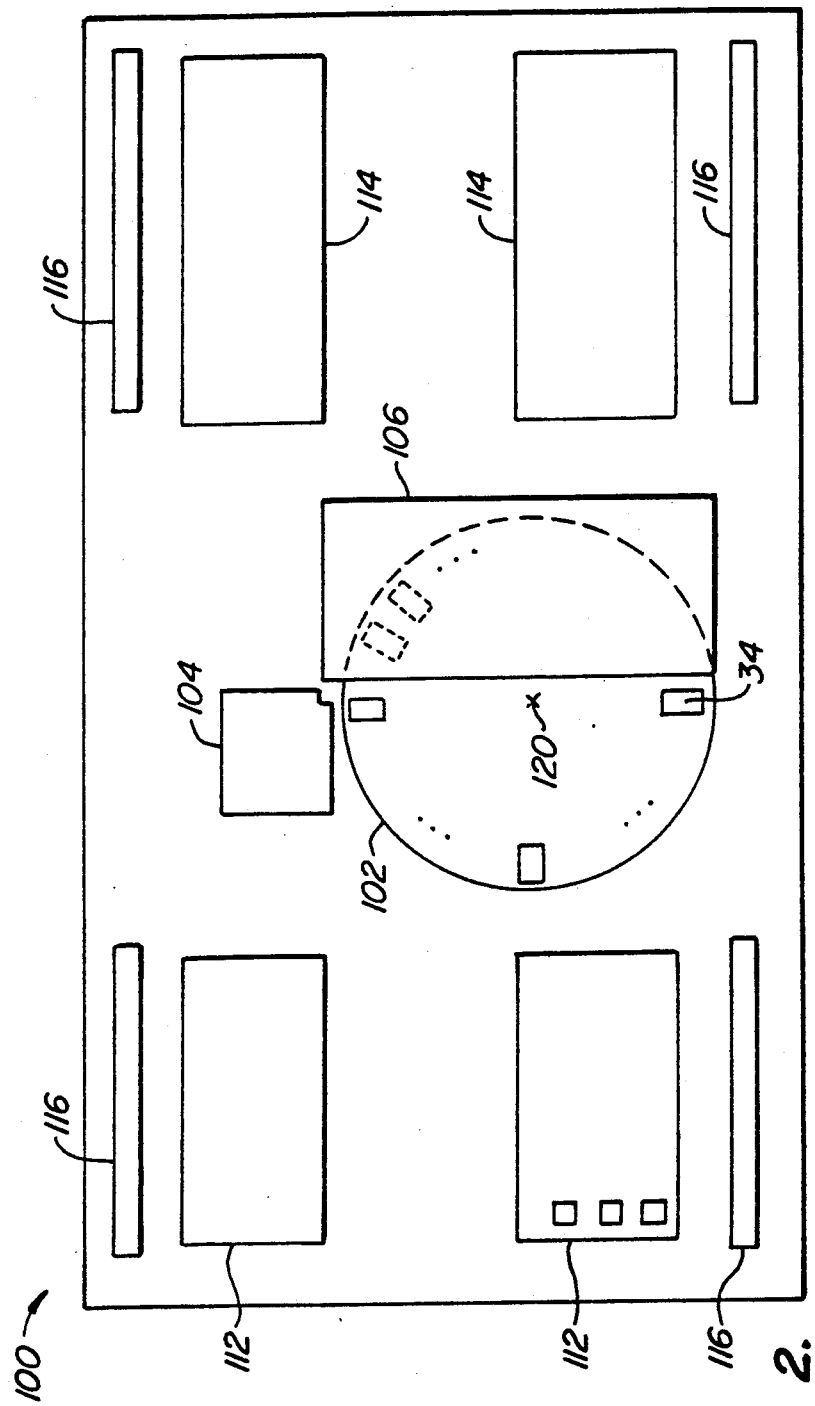
FIG. 2 is a schematic illustration of a system for marking or erasing a marking from a semiconductor chip package to illustrate the preferred embodiment.

FIG. 2 is a schematic illustration of a system for marking or erasing a marking from a semiconductor chip package to illustrate the preferred embodiment of the invention. The system of FIG. 2 includes portion 10 of FIG. 1 as described below. Identical parts in the different figures of this application are identified by the same numerals. System 100 of FIG. 2 includes a disk 102 with a number of depressions or pockets 34 of the type shown in FIG. 1. In other words, disk 102 includes the support structure 12 of FIG. 1, except that disk 102 contains a plurality of such structures. As shown in FIG. 2, disk 102 contains a dozen or more pockets or depressions each for holding a semiconductor chip package for marking or erasing a marking there from sequentially.

Disk 102 is rotated about its axis 120 past a marker 104 which is used to mark the package adjacent to it. Alternatively, the marker may be replaced by an erasing head for erasing a marking from the adjacent package. After the package is marked (or erased), rotation of disk 102 causes the marked package to enter a container 106 where the package is baked by means of ultraviolet light. Thus container 106 is equipped with an ultraviolet light source such as a lamp which illuminates all the packages when they are in box 106 for baking the package in order to cure the marking.

System 100 also includes trays 112 for holding semiconductor chip packages before they are picked up and placed into disk 102 and trays 114 for holding the semiconductor chip packages after they have been marked or erased in a marking or erasing process. System 100 also includes tracks 116 for one or more systems (not shown in FIG. 2) which pick up the packages from trays 112 and place them into depressions or pockets 34 in disk 102 and which pick up the marked or erased packages from disk 102 and place them in trays 114.

Figure 3:
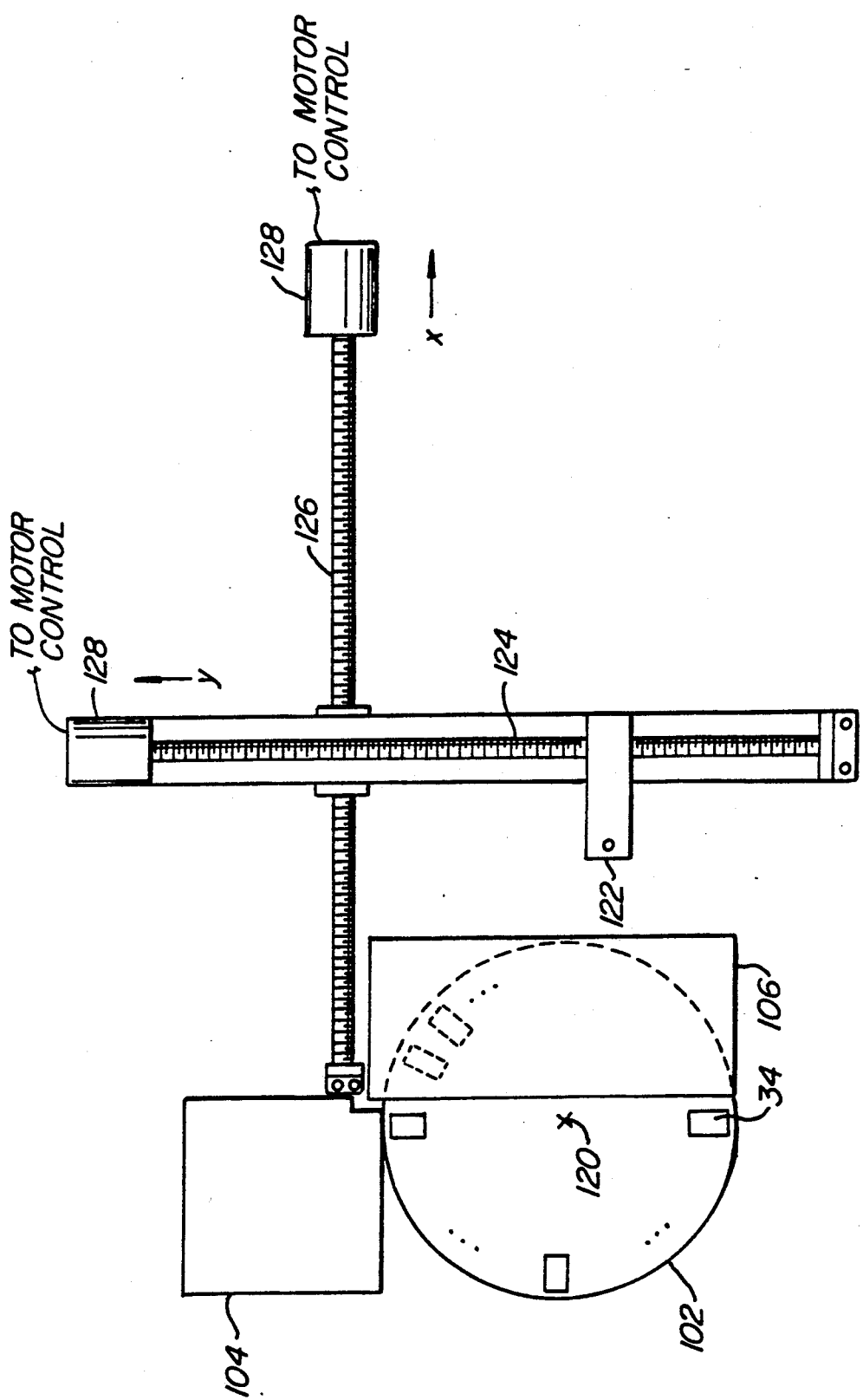
FIG. 3 is a top view of a portion of the system of FIG. 2, including rotary disk 102, a marker, and a vacuum pickup system for picking up and placing the semiconductor chip package to illustrate the preferred embodiment of the invention.

FIG. 3 is a top view of a portion of system 100 which includes a vacuum pickup system for picking up and placing the semiconductor chip package to illustrate the preferred embodiment in more detail. The pick and place system is essentially a tube (not shown in FIG. 3) connected to a vacuum pump (not shown in FIG. 3) which picks up a semiconductor chip package by contacting a surface of the chip with the tip of the tube where the vacuum in the tube causes the surface of the chip to be pushed towards the tube by atmospheric pressure, so that the package may be picked up. After the tube picks up a package from tray 112 and places it in a pocket 34, the arm releases the package by operating a valve (not shown) to turn off the connection of the tube to the vacuum pump and to restore the inside of the tube to atmospheric pressure. Such pick and place mechanisms are well-known in the packaging art and will not be described in detail. In the system of FIG. 3, the tube of the pick and place system may pick up each package by contacting the top surface of the package. After the packages emerge from container 106, the markings have been cured so that contact between the top surfaces of the packages and the pick and place system will not cause the markings to smear.

The tube under vacuum in the above description is connected to a vacuum pickup arm 122 which forms another part of the pick and place system; arm 122 moves the tube to locations appropriate for picking up and depositing the package 16. As shown in FIG. 3, the vacuum pickup arm 122 is moved by two lead screws 124, 126 and two motors 128 so that arm 122 may be moved along the X and Y axis. Arm 122 is moved by a mechanism (not shown) operated by pneumatic pressure along the Z-axis (defined as a direction perpendicular to the X-Y plane of FIG. 3) in a conventional manner. Thus arm 122 may be moved to any location to pick up the package and to place it at a desired location. System 100 may include two such vacuum pickup systems, one for picking up packages from trays 112 and placing them in pockets 34 and the other for picking up the packages after marking or erasing from disk 102 and placing them in trays 114.

FIGS. 4 and 5 are cross-sectional views of portions of system 100 to illustrate in more detail the preferred embodiment of the invention. As shown in FIG. 2, when disk 102 rotates a package to a location in the vicinity of marker 104, marker 104 (or erasing head) operates on the package to mark it or to erase a marking therefrom. As explained earlier, it is necessary to hold the package with sufficient force so that the marking and erasing process will be effective. This is performed by a vacuum assembly 150 which includes tube 14 of FIG. 1 as shown in FIG. 4.

As described above, disk 102 is rotated along its axis 120. Assembly 150 remains unchanged in position in the X-Y plane and moves only in the vertical Z direction. Disk 102 is rotated in angular step motions so that when a hole 42 in the disk is directly above the assembly 150, the assembly moves upwards until the tip of tube 14 contacts the bottom surface of disk 102 immediately below hole 42. The other end of tube 14 is connected to a vacuum source (not shown) which evacuates hole 42. As described above, this causes a semiconductor package (not shown above assembly 150) to be held to pedestal 36 with sufficient force for the marking or erasing process.

As described above, disk 102 should be rotated along its axis 120 by angular steps. Furthermore, in order to move tube 14 upwards at appropriate time to effectuate a vacuum in hole 42, it is desirable to sense the position of holes 42 in the disk so as to move the tube 14 upwards at the appropriate time. Such functions are illustrated in reference to FIGS. 4 and 5. As shown in FIGS. 4 and 5, disk 102 defines reference or sensor holes 152 located at such positions in disk 102 that when a particular reference or sensor hole 152 is sensed by a sensor 154, a corresponding hole 42 will be directly above tube 14, so that a mechanism (not shown) can be actuated to move tube 14 upwards to contact disk 102. Disk 102 is rotated by means of a turntable 162. Turntable 162 has a lower circular portion 164 of a smaller diameter which is rotated by means of a metal belt 166, spindle 168 and stepping motor 170. Motor 170, spindle 168 and belt 166 cause the turntable 162 to rotate in angular steps in order to position hole 142 of each pocket 34 above tube 14 sequentially.

Motor 170 and the mechanism for moving assembly 150 are both controlled by a controller (not shown) such as a microprocessor, which causes assembly 150 to be moved upwards when sensor 154 senses a hole 152. After a predetermined time has elapsed after assembly 150 has been moved upwards to contact disk 102 to allow adequate time for the marking or erasing process, the controller causes assembly 150 to be moved downwards and motor 170 to rotate disk 102 by a preset angle which causes another hole 42 to be immediately above tube 14 in order to mark or erase another package. Turntable 162 has protrusions 182 which fit snugly into indentations 184 in disk 102 so that the position of disk 102 may be accurately controlled by motor 170. This arrangement also permits different disks 102 to be used with the same drive mechanism (162, 164, 166, 168, 170) which is advantageous for reasons explained below.

Where the package to be marked or erased is rectangular in shape, the pedestal 36, depression 34 and the space surrounding the pedestal for housing the leads are also rectangular in shape. Obviously, the shapes of the pedestal, the depression and the space surrounding the pedestal may be altered to fit the particular type of package to be processed. Where the packages to be marked or to be erased are not rectangular in shape, a different disk with pockets shaped appropriately to hold such packages may be used to replace the disk with rectangular pockets. As shown in FIG. 2, the pockets or depressions 34 are preferably located on the circumference of an arc on surface 32 where the arc is centered at axis 120, so that rotation of disk 102 about axis 120 will cause the pockets to be sequentially immediately above tube 14.

To summarize, the method for marking or erasing a marking on a semiconductor chip package is as follows. The package with leads is placed onto the pedestal in a particular pocket 34 in disk 102. In the preferred embodiment, a plurality of such packages are each placed onto the pedestal of a corresponding pocket in the disk. Each pedestal has a conduit which can be evacuated. The conduit of a particular pocket is then evacuated and the package sitting immediately above the conduit is then marked or erased, so that the package is held to the pedestal by sufficient force for the marking or erasing, and so that the leads of the package are not bent or otherwise disturbed during the marking or erasing.

Where the process is to mark the package, the method further comprises heating the package after the marking to cure the ink. While in the preferred embodiment described above, a disk with many pockets and support structures is employed, it will be obvious that other configurations of support structures may be used and are within the scope of the invention. Whether or not a disk is used as described above, the plurality of packages supported by the support structure may be sequentially marked or erased by moving the structure relative to the marking or erasing head in order to sequentially mark or erase the packages. Where a disk is employed as in the preferred embodiment, such motion can be achieved by rotating the disk about its axis. Where the pockets 34 are located on the circumference of an arc centered at the axis of the disk, rotation of the disk will cause each pocket to be sequentially located immediately above tube 14 so that the packages can be sequentially marked or erased.

While the invention above has been described by reference to a preferred embodiment, various modifications may be made without departing from the scope of the invention which is to be limited only by the appended claims.

What is claimed is:

1. An apparatus for marking or erasing a marking on a semiconductor chip package having leads, said apparatus comprising:
   support structure for supporting the package, said support structure defining a conduit means therein, said support structure having a main surface and a depression therein at an elevation below the main surface, said support structure having a portion protruding upwards from the depression forming a pedestal, said depression defining space surrounding the pedestal for housing the leads when the pedestal is supporting the package so that the leads do not contact said support structure;
   means connected to said conduit means for evacuating the conduit means; and
   means for marking or erasing a marking on the package when the package is supported by said structure and when the conduit means is evacuated by said evacuating means, so that the package is held to said support structure by sufficient force for the marking or erasing, and so that the leads of the package are not disturbed during the marking or erasing.

2. The apparatus of claim 1, wherein said conduit means comprises a hole in the structure located underneath the package when the package is supported by the structure, so that when the hole is evacuated, the vacuum in the hole will cause the package to be held to the structure by sufficient force for marking or erasing.

3. The apparatus of claim 2, said package having a top surface for receiving the marking or from which a marking is to be erased and a bottom surface adapted to contact the support structure when the package is supported by the structure during the marking or erasing, wherein said marking or erasing means performs the marking or erasing on the top surface of the package.

4. The apparatus of claim 3, further comprising means for picking up the package and placing the package onto the structure before the marking or erasing and for picking up the package after the marking or erasing.

5. The apparatus of claim 4, wherein said picking and placing means picks up the package by contacting the top surface of the package.

6. The apparatus of claim 1, further comprising means for baking the package after the marking.

7. The apparatus of claim 1, wherein the package is rectangular in shape, and wherein the pedestal, the depression and the space surrounding the pedestal for housing the leads are also rectangular in shape.

8. The apparatus of claim 1, wherein the depressions are defined by drop-off surfaces adjacent the main surface, said surfaces of at least one depression being chamfered, so that when the package is placed into such depression and onto the pedestal in such depression, the package will be automatically centered onto the pedestal.

9. The apparatus of claim 1, wherein the pedestal has a top surface adapted to contact the package when the pedestal is supporting the package, and wherein said top surface is at such an elevation relative to the main surface that when the package is in contact with the top surface of the pedestal, at least a portion of the package is above said main surface so that the marking or erasing is conveniently performed.

10. The apparatus of claim 1, wherein said support structure defines a surface having therein a plurality of depressions each shaped to hold a package, and wherein said marking or erasing means marks or erases marks sequentially from said packages in said plurality of depressions.

11. The apparatus of claim 10, further comprising means for moving said surface relative to said marking or erasing means to sequentially mark or erase said packages.

12. The apparatus of claim 11, wherein said depressions are arranged on the circumference of an arc on the surface, said arc having a center, said moving means including means for rotating the surface about said center.

13. A method for marking or erasing a marking on a semiconductor chip package having leads and employing a support structure for supporting the package, the structure defining a conduit means therein and having a depression therein for holding the leads so that the leads do not contact the structure when positioned thereon, said method comprising:

placing a semiconductor chip package with leads onto the support structure, such that the leads are situated in the depression and do not contact the support structure;

evacuating the conduit means; and marking or erasing a marking on the package when the conduit means is being evacuated, so that the package is held to the support structure by sufficient force for the marking or erasing, and so that the leads of the package are not disturbed during the marking or erasing.

14. The method of claim 13, wherein said step of marking or erasing marks the package and further comprises the step of heating the package after the marking.

15. The method of claim 13, wherein the support structure defines a surface having therein a plurality of depressions each shaped to hold a package, wherein said placing step places a plurality of semiconductor packages, each into a depression, and wherein said marking or erasing step marks or erases marks sequentially from said packages in said plurality of depressions.

16. The method of claim 15, said method employing a marking or erasing head for performing the marking or erasing, said method further comprising moving said structure and said surface of the structure relative to said marking or erasing head to sequentially mark or erase said packages.

17. The method of claim 16, wherein said depressions are arranged on the circumference of an arc on the surface, said arc having a center, said moving step including rotating the surface about said center.

* * * * *